(12) United States Patent  
Miyazaki

(10) Patent No.: US 6,949,804 B2  
(45) Date of Patent: Sep. 27, 2005

(54) SEMICONDUCTOR DEVICE WITH GATE DIELECTRIC FILM HAVING AN OXIDE FILM AND AN OXYNITRIDE FILM

(75) Inventor: Toshihiko Miyazaki, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/777,473

(22) Filed: Feb. 12, 2004

(65) Prior Publication Data

US 2004/0201069 A1 Oct. 14, 2004

(30) Foreign Application Priority Data

Feb. 14, 2003 (JP) ........................................ 2003-036447  
Feb. 14, 2003 (JP) ........................................ 2003-036448

(51) Int. Cl.$^7$ ............................................. H01L 29/772  
(52) U.S. Cl. ...................................................... 257/410  
(58) Field of Search .................................. 257/411, 490

(56) References Cited

U.S. PATENT DOCUMENTS 6,372,581 B1 * 4/2002 Bensahel et al.

\* cited by examiner

Primary Examiner—Nathan J. Flynn  
Assistant Examiner—Kevin Quinto  
(74) Attorney, Agent, or Firm—Hogan & Hartson, LLP

(57) ABSTRACT

A semiconductor device includes a silicon substrate and a gate dielectric film provided on the silicon substrate. The gate dielectric film includes at least a first oxide film and an oxynitride film formed on the first oxide film. A peak position of a concentration of nitrogen of the gate dielectric film is located in a range of 0.5 nm–1.5 nm from a surface thereof, and in a range of 0.3 nm–2.0 nm from an interface thereof with the silicon substrate, and an element concentration peak of the nitrogen is $7 \times 10^{21}$ or greater.

9 Claims, 8 Drawing Sheets

SEMICONDUCTOR DEVICE WITH GATE DIELECTRIC FILM HAVING AN OXIDE FILM AND AN OXYNITRIDE FILM

BACKGROUND OF THE INVENTION

1. Field of the Invention

The present invention relates to semiconductor devices and methods for manufacturing semiconductor devices, and more particularly, is preferably applied to a method for forming oxynitride dielectric films.

2. Description of Related Art

There exists a known method for forming the gate dielectric film of a semiconductor device in a two-layer structure of an oxynitride film (oxide film including nitrogen) and an oxide film, in order to prevent boron contained in a P-type polysilicon gate from diffusing into the silicon substrate through the gate dielectric film and to thereby prevent the threshold voltage from changing.

In the method described above, an oxynitride film is formed by using nitrogen monoxide gas, at a temperature of 1000° C., for a duration of 20 seconds. Also, an oxide film is formed by wet oxidation with the flow rate of $H_2/O_2=5$ slm/slm, at a temperature of 850° C., for a duration of 3 minutes; alternatively, by dry oxidation with the flow rate of $O_2=2$ slm, at a temperature of 1000° C., for a duration of 3 minutes.

Also, there is a known method for forming the gate dielectric film of a semiconductor device with an oxide film such as a $SiO_2$ film, in order to form the gate dielectric film on a silicon substrate.

FIG. 7 is a cross-sectional view showing a conventional method for manufacturing a semiconductor device.

Referring to FIG. 7, a silicon substrate 11 is heat-treated with oxygen gas G12, to thereby form an oxide film 12 on the silicon substrate 11.

Also, in order to reduce the amount of gate leakage to the gate dielectric film, there is a method for forming the gate dielectric film with an oxynitride film (oxide film containing nitrogen) such as a SiON film.

FIG. 8 is a cross-sectional view indicating another example of a conventional method for manufacturing a semiconductor device.

Referring to FIG. 8, a silicon substrate 21 is heat-treated with dinitrogen monoxide gas G13, to thereby form an oxynitride film 22 on the silicon substrate 21.

Also, there exists a method of forming a gate dielectric film in a three-layer structure with an oxide film, an oxynitride film and an oxide film, in order to suppress generation of an interface state with the silicon substrate, and to reduce the amount of gate leakage to the gate dielectric film.

SUMMARY OF THE INVENTION

A semiconductor device in accordance with the present invention includes a silicon substrate, and a gate dielectric film provided on the silicon substrate, which includes at least a first oxide film and an oxynitride film formed on the first oxide film, wherein a peak position of the concentration of nitrogen of the gate dielectric film is located in the range of 0.5 nm–1.5 nm from a surface thereof, and in the range of 0.3 nm–2.0 nm from its interface with the silicon substrate, and an element concentration peak of the nitrogen is $7\times10^{21}$ or greater.

As a result, the nitrogen concentration at the interface between the gate dielectric film and the silicon substrate can be maintained at a low level, and the nitrogen concentration within the gate dielectric film can be increased, such that an increase in the interface state can be suppressed, and the amount of gate leakage can be further reduced.

The gate dielectric film further includes a second oxide film formed on the oxynitride film, the peak position of the concentration of nitrogen of the gate dielectric film is located in the range of 0.3 nm–2.0 nm from its interface with the silicon substrate, and the element concentration peak of the nitrogen is $7\times10^{21}$ or greater.

As a result, while the nitrogen concentration at the interface between the gate dielectric film and the silicon substrate can be maintained to be low, the nitrogen concentration in the gate dielectric film can be increased, and the thickness of the gate dielectric film can be adjusted.

Accordingly, even when the gate dielectric film is made thinner, an increase in the interface state can be suppressed, the amount of gate leakage can be further reduced, and the flatness of the gate dielectric film can be improved.

A method for manufacturing a semiconductor device in accordance with the present invention includes a step of forming an oxynitride film on a surface of a silicon substrate by performing a heat treatment on the silicon substrate with oxynitriding gas under a condition in the range of 1000° C.–1150° C. for 120–200 seconds, and a step of forming a first oxide film on the surface of the silicon substrate by conducting a heat treatment on the silicon substrate with a first oxidizing gas.

Accordingly, the nitrogen concentration in the gate dielectric film can be increased, the peak position of the nitrogen concentration can be pushed up towards the surface, an increase in the interface state can be suppressed, and the amount of gate leakage can be further reduced.

Also, the method further includes the step of forming the oxynitride film. The heat treatment on the silicon substrate with the oxynitriding gas is conducted under a condition in the rage of 1100° C.–1150° C., for 20–200 seconds.

Accordingly, the nitrogen concentration in the gate dielectric film can be increased, the peak position of the nitrogen concentration can be pushed up towards the surface side, an increase in the interface state can be suppressed, and the amount of gate leakage can be further reduced.

According to the method for manufacturing the semiconductor device described above, the film thickness of the oxynitride film is in the range of 0.5 nm–3.0 nm, and the film thinness of the first oxide film is greater than 0 nm, and less than 1.0 nm.

Accordingly, an increase in the interface state can be suppressed, the nitrogen concentration in the gate dielectric film can be increased, the amount of gate leakage can be further reduced, and the deterioration in the carrier mobility at the time of fabricating a field effect transistor can be suppressed.

Also, according to the method for manufacturing a semiconductor device described above, a step is included for forming a second oxide film on a surface of the silicon substrate by conducting a heat treatment on the silicon substrate with the second oxidizing gas before the step of forming the oxynitride film.

Accordingly, the nitrogen concentration in the gate dielectric film can be increased, the first oxide film can be formed on the surface of the silicon substrate at high temperatures, and influences of variations in the film thickness of the oxynitride film and its concentration distribution can be suppressed, while oxygen molecules can be diffused on the surface of the silicon substrate.

Consequently, while maintaining the in-plane uniformity of the film thickness of the first oxide film, the peak position of nitrogen concentration can be pushed up towards the surface, and while suppressing an increase in the interface state, the amount of gate leakage can be further reduced and the flatness of the gate dielectric film can be improved.

In the method for manufacturing a semiconductor device described above, the second oxidizing gas is a gas mixture of oxygen gas and nitrogen gas with the oxygen gas being mixed by 10–30 weight %, the temperature of the heat treatment at the time of forming the first oxide film is in the range of 800° C.–1000° C., and the duration is in the range of 20–60 seconds.

Accordingly, while lowering the partial pressure of the oxygen gas, the second oxide film can be formed on the surface of the silicon substrate at high temperatures, the flatness and smoothness of the surface of the second oxide film can be maintained, and the control over the film thickness of the second oxide film can be readily conducted.

Also, in the method for manufacturing a semiconductor device described above, the thickness of the first oxide film is in the range of 0.3 nm–1.0 nm, the film thickness of the second oxide film is in the range of 0.5 nm–2.0 nm, and the film thickness of the oxynitride film is in the range of 0.3 nm–1.5 nm.

Accordingly, an increase in the interface state can be suppressed, the nitrogen concentration in the gate dielectric film can be increased, the amount of gate leakage can be further reduced, and the deterioration in the carrier mobility at the time of fabricating a field effect transistor can be suppressed.

DETAILED DESCRIPTION OF THE PREFERRED EMBODIMENTS

A semiconductor device and its manufacturing method in accordance with embodiments of the present invention are described below with reference to the accompanying drawings.

Figure 1:
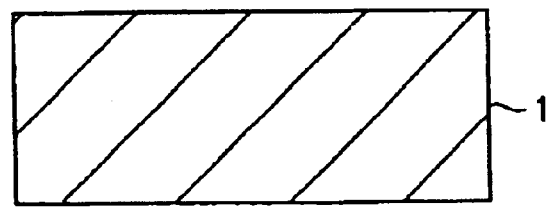
FIGS. 1(a)–1(c) illustrate cross-sectional views showing a method for manufacturing a semiconductor device in accordance with a first embodiment of the present invention.
Figure 1:
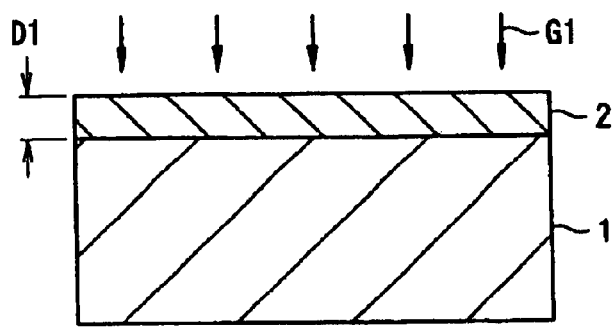
Figure 1:
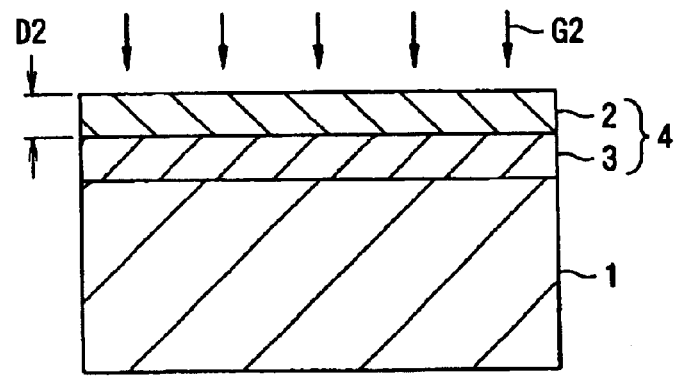

FIGS. 1(a) to 1(c) are cross-sectional views showing a method for manufacturing a semiconductor device in accordance with a first embodiment of the present invention.

In FIG. 1(a), surfaces of a silicon substrate 1 are washed with a solution such as hydrofluoric acid, to thereby remove naturally occurring oxide films on the surfaces of the silicon substrate 1, and expose a surface of the silicon substrate 1. By removing the naturally occurring oxide films on the surfaces of the silicon substrate 1, the surfaces of the silicon substrate 1 can be planarized, and the amount of gate leakage can be reduced.

Next, as indicated in FIG. 1(b), the silicon substrate 1 is heat-treated with an oxynitriding gas G1, to thereby form an oxynitride film 2 on the surface of the silicon substrate 1. As for the oxynitriding gas G1 for forming the oxynitride film 2, for example, nitrogen monoxide, nitrogen dioxide or dinitrogen monoxide can be used.

Accordingly, the reactivity of the oxynitride film 2 at the time of formation thereof with the silicon substrate 1 can be improved, such that the nitrogen concentration in the gate dielectric film can be increased, and the amount of gate leakage can be further reduced.

Also, during the heat treatment condition at the time of forming the oxynitride film 2, the temperature can be in the range of 1000° C.–1150° C., and the duration can be 120 to 200 seconds. Also, during the heat treatment condition when forming the oxynitride film 2, the temperature may be in the range of 1100° C.–1150° C., and the duration may be 20–200 seconds. Also, the film thickness D1 of the oxynitride film 2 may preferably be in the range of 0.3 nm–1.5 nm.

As a result, the nitrogen concentration in the gate dielectric film 4 that is made of a two-layer structure of the oxynitride film 2 and the oxide film 3 can be increased, such that the amount of gate leakage can be further reduced.

Next, as indicated in FIG. 1(c), by heat treating the silicon substrate 1 with the oxidizing gas G2, an oxide film 3 is formed on the surface of the silicon substrate 1 while pushing up the oxynitride film 2 formed on the silicon substrate 1 towards the surface side.

As the oxidizing gas G2, for example, oxygen gas or water vapor (water) can be used. Also, the temperature for the heat treatment to form the oxide film 3 is preferably in the range of 1000° C.–1150° C., and more preferably be in the range of 1100° C.–1150° C. Also, the duration for the heat treatment to form the oxide film 3 is preferably be 20–300 seconds. Also, the film thickness D2 of the oxide film 3 may be in the range of 0.3 nm–1.0 nm.

Accordingly, the oxide film 3 can be formed on the surface of the silicon substrate 1 at high temperatures, such that the silicon oxide film can be grown on the surface of the silicon substrate 1, while suppressing the influence of variations in the film thickness of the oxynitride film 2 and its concentration distribution.

For this reason, while maintaining the in-plane uniformity of the film thickness of the oxide film 3, the peak position of nitrogen concentration can be pushed up towards the surface, and while suppressing an increase in the interface state, the amount of gate leakage can be further reduced and the flatness of the gate dielectric film 4 can be improved.

Also, by forming the gate dielectric film 4 under the conditions described above, the element concentration peak of nitrogen can be $7 \times 10^{21}$ or greater, and the peak position of the nitrogen concentration of the gate dielectric film 4 can be located in the range of 0.5 nm–1.5 nm from the surface thereof, and in the range of 0.3 nm–2.0 nm from its interface with the silicon substrate 1. Consequently, even when the gate dielectric film 4 is thinned down to about several ten Angstroms, while the nitrogen concentration at the interface between the gate dielectric film 4 and the silicon substrate 1 can be maintained at a low level, the nitrogen concentration in the gate dielectric film 4 can be increased.

Figure 2:
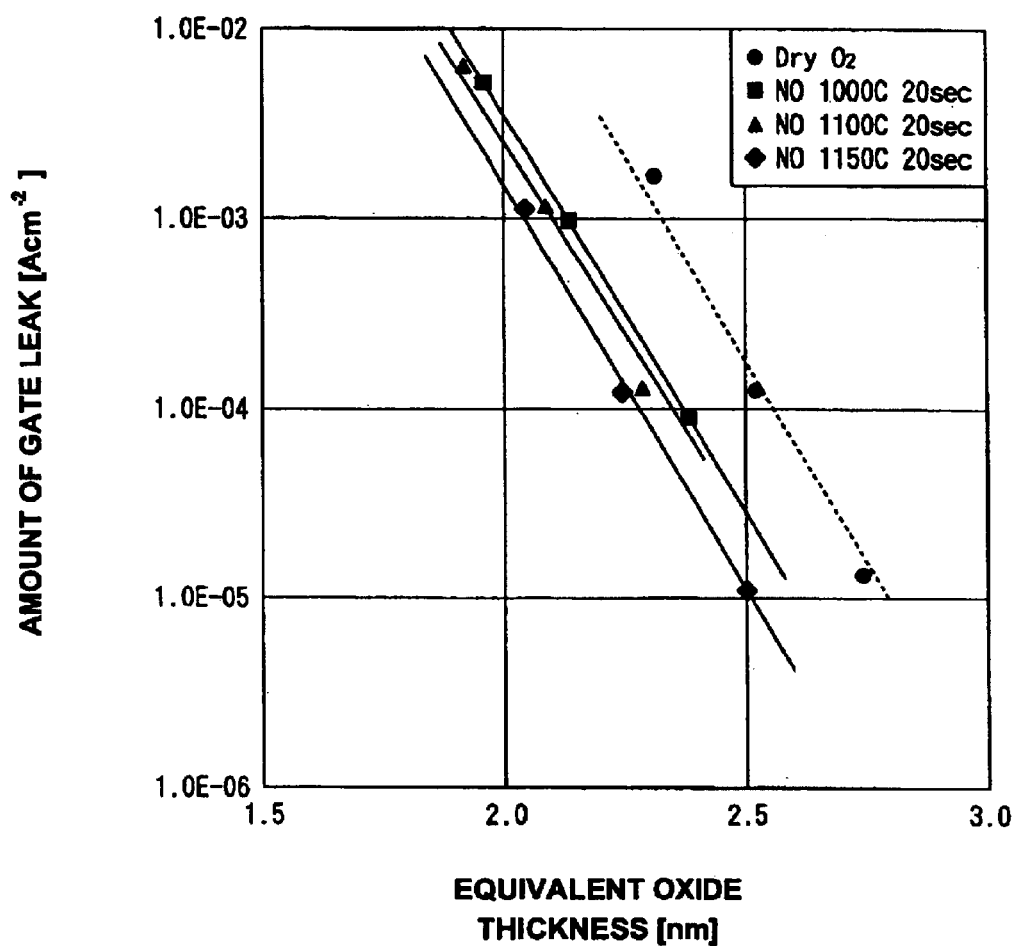
FIG. 2 is a diagram showing the relationship between the equivalent oxide thickness and the amount of gate leak in accordance with the first embodiment of the present invention.

FIG. 2 is a diagram showing the relationship between the equivalent oxide thickness and the amount of gate leakage in accordance with the first embodiment of the present invention when the temperature of the oxynitriding treatment is used as a parameter. It is noted that the equivalent oxide thickness is an electric film thickness that is calculated by using the physical constants of an oxide film. Further, in the example shown in FIG. 2, oxynitride films 3 are formed with nitrogen monoxide gas under different conditions at temperatures of 1000° C., 1100° C. and 1150° C. in 20 seconds time durations, respectively. Also, oxide films 2 are formed with oxygen gas at a temperature of 1100° C. The amount of gate leakage of each of the gate dielectric films 4 each being made of a two-layer structure of the oxide film 2 and the oxynitride film 3 is compared to the amount of gate leakage of a gate dielectric film that is made only of an oxide film.

It is observed from FIG. 2 that, compared to the gate dielectric film made only of an oxide film, the gate dielectric film 4 that is made of the two-layer structure of the oxide film 2 and the oxynitride film 3 can reduce the amount of gate leakage. Here, when the temperature at the time of forming the oxynitride film 3 is set at 1000° C., the amount of gate leakage can be reduced only by about ½ digit. However, when the temperature at the time of forming the oxynitride film 3 is set in the range of 1100° C.–1150° C., the amount of gate leakage can be reduced by more than one digit.

Figure 3:
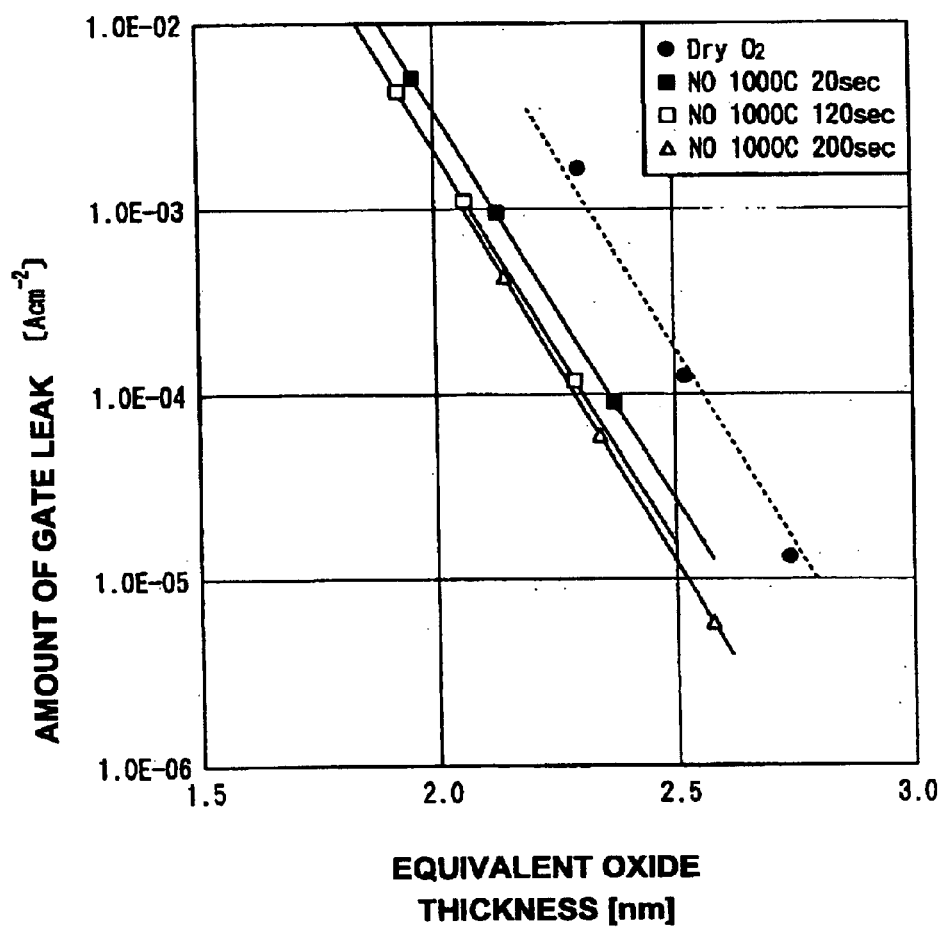
FIG. 3 is a diagram showing the relationship between the equivalent oxide thickness and the amount of gate leak in accordance with the first embodiment of the present invention.

FIG. 3 is a diagram showing the relationship between the equivalent oxide thickness and the amount of gate leakage in accordance with the first embodiment of the present invention when the duration of the oxynitriding treatment is set as a parameter. In the example shown in FIG. 3, oxynitride films 3 are formed with nitrogen monoxide gas under different conditions at a temperature of 1000° C. at time durations of 20 seconds, 120 seconds and 200 seconds, respectively. Also, oxide films 2 are formed with oxygen gas at a temperature of 1100° C. The amount of gate leakage of each of the gate dielectric films 4 each being made of a two-layer structure of the oxide film 2 and the oxynitride film 3 is compared to the amount of gate leakage of a gate dielectric film that is made only of an oxide film.

It is observed from FIG. 3 that, compared with the gate dielectric film made only of an oxide film, the gate dielectric film 4 that is made of the two-layer structure of the oxide film 2 and the oxynitride film 3 can reduce the amount of gate leakage. Here, when the time for forming the oxynitride film 3 is set at 20 seconds, the amount of gate leakage can be reduced only by about ½ digit. However, when the time for forming the oxynitride film 3 is set in the range of 120 seconds–200 seconds, the amount of gate leakage can be reduced by more than one digit.

Figure 4:
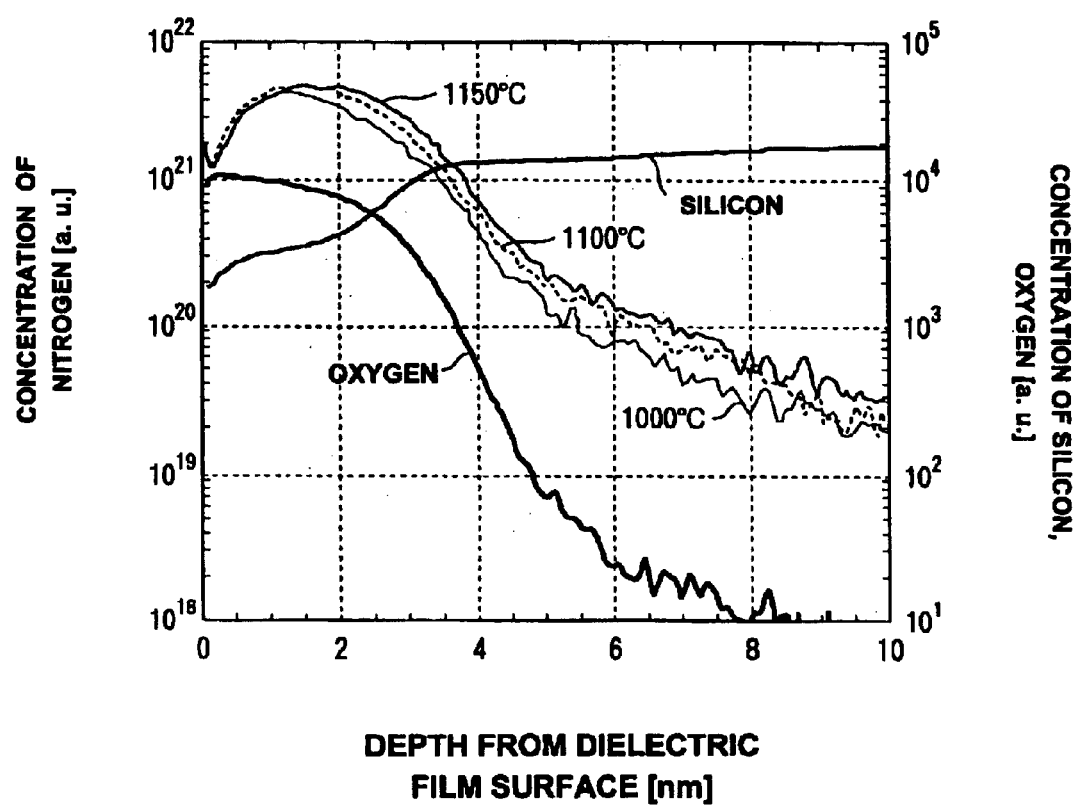
FIG. 4 is a diagram showing the relationship between the depth from the surface of the dielectric film and the nitrogen concentration in accordance with the first embodiment of the present invention.

FIG. 4 is a diagram showing the relationship between the depth from the surface of the dielectric film and the nitrogen concentration in accordance with the first embodiment of the present invention. In the example shown in FIG. 4, each gate dielectric film 4 is made of a two-layer structure of an oxide film 2 and an oxynitride film 3, where the oxynitride film 3 is formed with nitrogen monoxide gas under different conditions at temperatures of 1000° C., 1100° C. and 1150° C. for a duration of 20 seconds, respectively, and oxide films 2 are formed with oxygen gas at a temperature of 1100° C. Then, by using SIMS (secondary-ion mass spectrometry), the element concentration of nitrogen, the element concentration of silicon and the element concentration of oxygen in the depth direction from the surface of the gate dielectric film 4 are examined.

It is observed from FIG. 4 that an interface between the silicon substrate 1 and the gate dielectric film 4 is located at about 25 Angstroms from the surface of the gate dielectric film 4, and the thickness of the gate dielectric film 4 is about 25 Angstroms. Also, by elevating the temperature at the time of forming the oxynitride film 3, the element concentration of nitrogen in the gate dielectric film can be increased.

Next, a semiconductor device and its manufacturing method in accordance with a second embodiment of the present invention will be described with reference to the accompanying drawings.

FIGS. 5(a)–5(d) are cross-sectional views indicating a method for manufacturing a semiconductor device in accordance with the second embodiment of the present invention.

Figure 5:
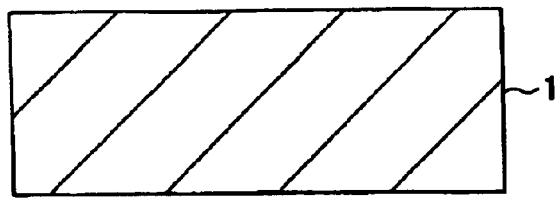
FIGS. 5(a)–5(c) illustrate cross-sectional views showing a method for manufacturing a semiconductor device in accordance with a second embodiment of the present invention.
Figure 5:
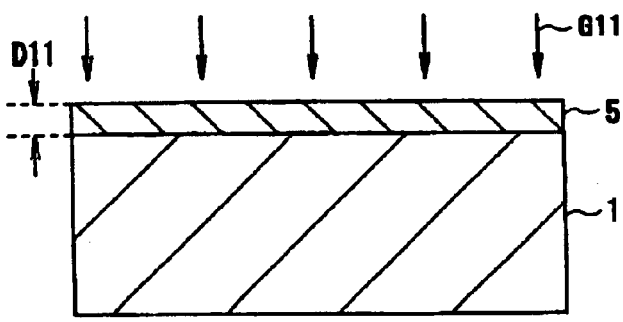
Figure 5:
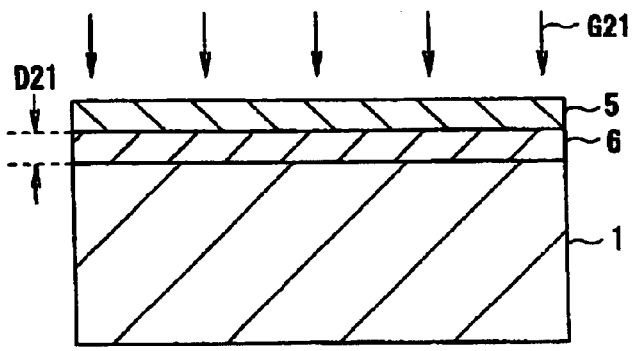
Figure 5:
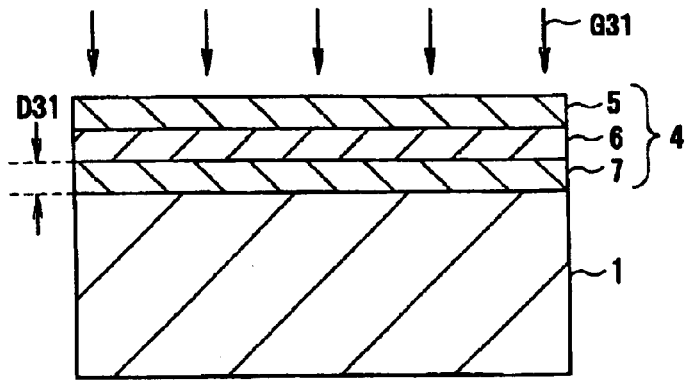

In FIG. 5(a), surfaces of a silicon substrate 1 are washed in an inactive atmosphere such as nitrogen gas or argon gas, to thereby remove naturally occurring oxide films on the surfaces of the silicon substrate 1, and expose a surface of the silicon substrate 1. By removing the naturally occurring oxide films on the surfaces of the silicon substrate 1, an interface between the silicon substrate 1 and an oxide film can be planarized, and the uniformity in film thickness of the oxide film to be formed on the silicon substrate 1 can be improved.

Next, as indicated in FIG. 5(b), the silicon substrate 1 is heat-treated with oxidizing gas G11, to thereby form an oxide film 5 on a surface of the silicon substrate 1. As the oxidizing gas G11, for example, mixed gas of oxygen gas and nitrogen gas can be used, and the rate of the oxygen gas in the mixed gas may preferably be 10–30 weight %, and more preferably be 15–25 weight %. Also, the temperature for the heat treatment to form the oxide film 5 is preferably in the range of 800° C.–1000° C., and more preferably be in the range of 850° C.–950° C. Also, the duration of the heat treatment to form the oxide film 5 is preferably 20–60 seconds. Also, the film thickness D11 of the oxide film 5 may be in the range of 0.5 nm–2.0 nm.

Accordingly, while reducing the partial pressure of the oxygen gas contained in the oxidizing gas G11, the oxide film 5 can be formed on the surface of the silicon substrate 1 at high temperatures, such that the film thickness of the oxide film 5 can be readily controlled while maintaining the flatness and smoothness of the surface of the oxide film 5. As a result, the film thickness of a gate dielectric film 4 that is made of a three-layer structure of the oxide film 5, an oxynitride film 6 and an oxide film 7 can be readily controlled, while suppressing an increase in the interface state, and also the flatness of the gate dielectric film 4 can be improved such that a deterioration in the dielectric breakdown strength can be suppressed.

Next, as indicated in FIG. 5(c), by heat treating the silicon substrate 1 with oxynitriding gas G21, an oxynitride film 6 is formed on the surface of the silicon substrate 1 while pushing up the oxide film 5 formed on the silicon substrate 1 towards the surface side.

As the oxynitriding gas G21, for example, nitrogen monoxide, nitrogen dioxide, dinitrogen monoxide or ammonia can be used.

Accordingly, the reactivity of the oxynitride film 6 at the time of its formation with the silicon substrate 1 can be improved, such that the nitrogen concentration in the gate dielectric film 4 can be increased, and the amount of gate leakage can be further reduced.

Also, the temperature of the heat treatment for forming the oxynitride film 6 may preferably be in the range of 1000° C.–1150° C., and more preferably be in the range of 1100° C.–1150° C. Also, the time duration for forming the oxynitride film 6 may preferably be 20 to 200 seconds, and more preferably be 120 to 200 seconds. Also, the film thickness D21 of the oxynitride film 6 may preferably be in the range of 0.3 nm–1.5 nm.

As a result, the nitrogen concentration in the gate dielectric film 4 can be increased, the amount of gate leakage can be further reduced, and deterioration in the carrier mobility at the time of fabricating a field effect transistor can be suppressed. Next, as indicated in FIG. 5(d), the silicon substrate 1 is heat-treated with oxidizing gas G31, to form an oxide film 7 on the surface of the silicon substrate 1 while pushing up the oxide film 5 and the oxynitride film 6 formed on the silicon substrate 1 towards the surface side.

As the oxidizing gas G31, for example, oxygen gas can be used. Also, the temperature of the heat treatment for forming the oxide film 7 may preferably be in the range of 1000° C.–1150° C., and more preferably be in the range of 1100° C.–1150° C. Also, the duration for forming the oxide film 7 may preferably be 20 to 300 seconds. Also, the film thickness D31 of the oxide film 7 may preferably be in the range of 0.3 nm–1.0 nm.

As a result, the oxide film 7 can be formed on the surface of the silicon substrate 1 at high temperatures, such that oxygen molecules can be diffused on the surface of the silicon substrate 1, while suppressing the influence of variations in the film thickness of the oxynitride film 6 and its concentration distribution.

Consequently, while maintaining the in-plane uniformity of the film thickness of the oxide film 7, the peak position of nitrogen concentration can be pushed up towards the surface, and while suppressing an increase in the interface state, the amount of gate leakage can be further reduced and the flatness of the gate dielectric film 4 can be improved.

Also, by forming the gate dielectric film under the conditions described above, the element concentration peak of nitrogen can be $7 \times 10^{21}$ or greater, and the peak position of the nitrogen concentration of the gate dielectric film 4 can be located in the range of 0.3 nm–2.0 nm from the interface with the silicon substrate 1. Consequently, even when the gate dielectric film 4 is thinned down to about several ten Angstroms, while the nitrogen concentration at the interface between the gate dielectric film 4 and the silicon substrate 1 can be maintained at a low level, the nitrogen concentration in the gate dielectric film 4 can be increased.

Figure 6:
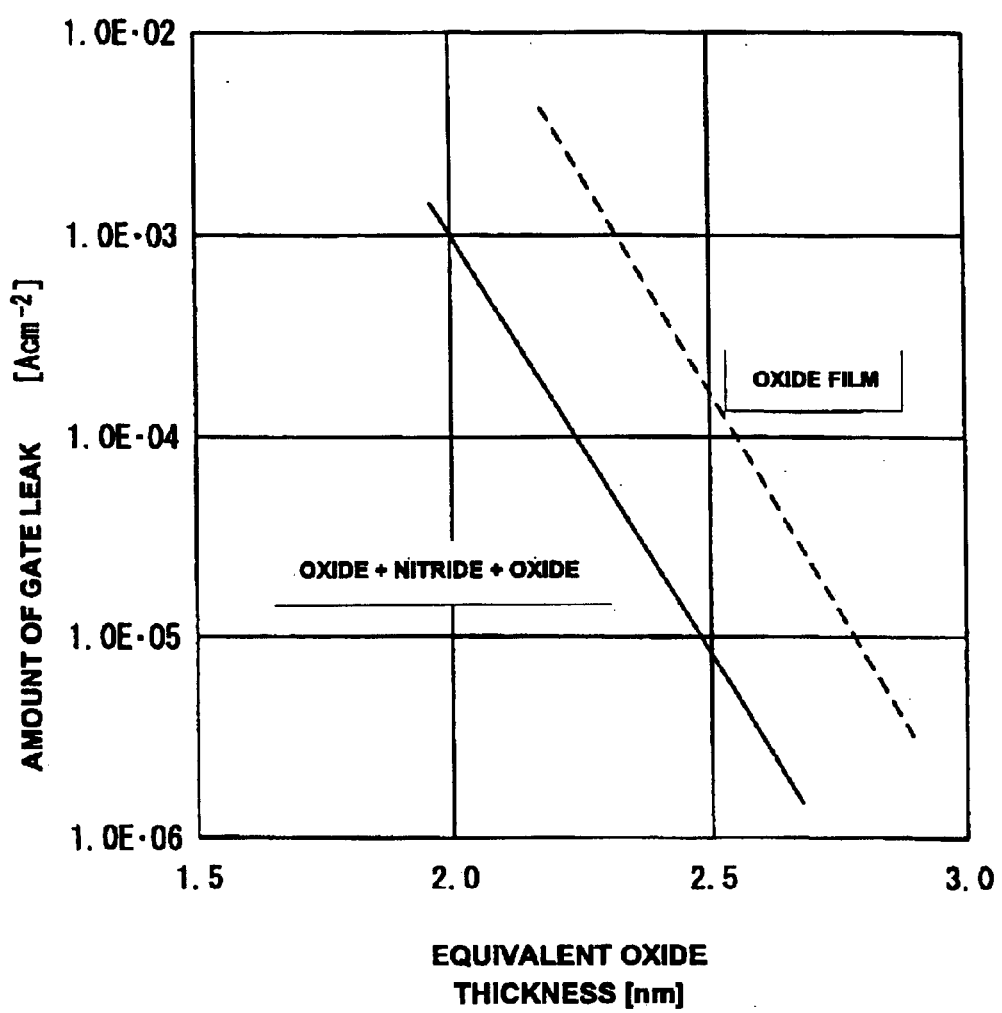
FIG. 6 is a diagram showing the relationship between the equivalent oxide thickness and the amount of gate leak in accordance with the second embodiment of the present invention.
Figure 7:
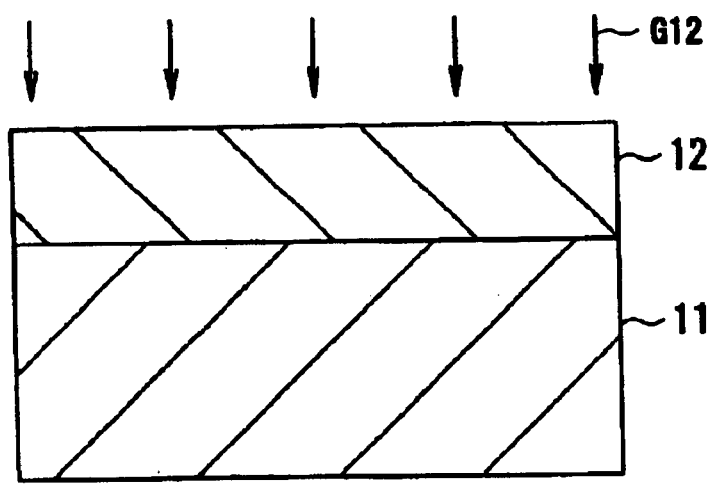
FIG. 7 illustrates a cross-sectional view indicating a conventional method for manufacturing a semiconductor device.
Figure 8:
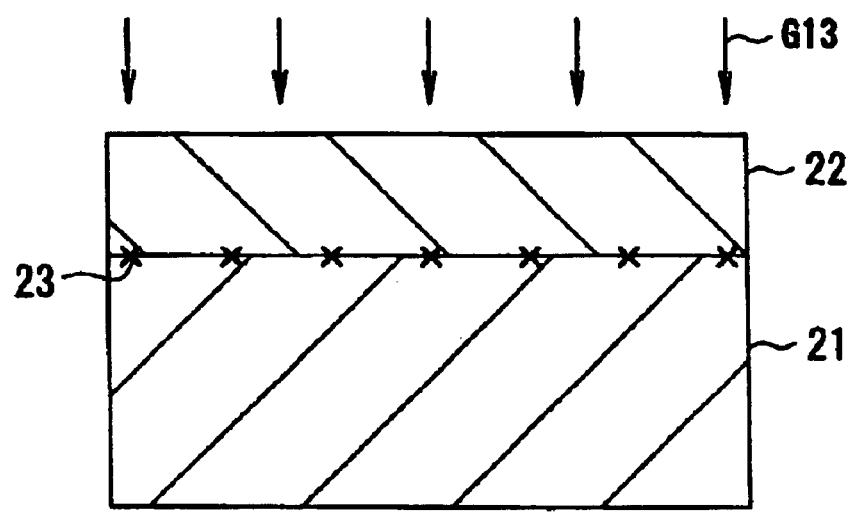
FIG. 8 illustrates a cross-sectional view indicating a conventional method for manufacturing a semiconductor device.

FIG. 6 is a diagram showing the relationship between the equivalent oxide thickness and the amount of gate leakage of a semiconductor device in accordance with an embodiment of the present invention. In the example shown in FIG. 6, each oxide film 5 is formed in a gas mixture of oxygen gas and nitrogen gas with the oxygen gas being mixed by 20 weight % at a temperature of 900° C. Also, each oxynitride film 6 is formed with nitrogen monoxide gas at a temperature of 1150° C. for a duration of 20 seconds. Also, each oxide film 7 is formed with oxygen gas at a temperature of 1150° C. for a duration of 60 seconds. Also, by adjusting the duration of the heat treatment for forming the oxide film 5, the total film thickness (equivalent oxide thickness) is adjusted.

In FIG. 6, gate dielectric films 4 are each composed of a three-layer structure of the oxide film 5, the oxynitride film 6 and the oxide film 7, wherein the heat treating temperature at the time of forming the oxynitride film 6 is set in the range of 1000° C.–1150° C., and the duration of the heat treatment is set in the range of 20–200 seconds. As a result, the amount of gate leakage can be reduced by more than one digit compared to the case where a gate dielectric film is made only of an oxide film.

What is claimed is:

1. A semiconductor device, comprising:
   a silicon substrate; and
   a gate dielectric film provided on the silicon substrate, the gate dielectric film includes at least a first oxide film and an oxynitride film formed on the first oxide film,
   wherein a peak position of a concentration of nitrogen of the gate dielectric film is located in a range of 0.5 nm–1.5 nm from a surface thereof, and in a range of 0.3 nm–2.0 nm from an interface thereof with the silicon substrate, and an element concentration peak of the nitrogen is $7 \times 10^{21}$ or greater.

2. The semiconductor device according to claim 1, further comprising a second oxide film formed on the oxynitride film, the peak position of the concentration of nitrogen of the gate dielectric film is located in a range of 0.3 nm–2.0 nm from the interface with the silicon substrate, and the element concentration peak of the nitrogen is $7 \times 10^{21}$ or greater.

3. The semiconductor device according to claim 1, wherein the silicon substrate has been washed with hydrofluoric acid.

4. The semiconductor device according to claim 1, wherein the silicon substrate is planarized.

5. The semiconductor device according to claim 1, wherein the oxynitride film is formed from the group consisting of nitrogen monoxide gas, nitrogen dioxide gas and dinitrogen monoxide gas.

6. The semiconductor device according to claim 1, wherein a thickness of the oxynitride film is in a range of 0.3 nm–1.5 nm.

7. The semiconductor device according to claim 1, wherein a thickness of the oxide film is in a range of 0.3 nm–1.0 nm.

8. A semiconductor device comprising:
   a silicon substrate; and
   means for reducing an amount of gate leakage, wherein a peak position of a concentration of nitrogen of the means for reducing an amount of gate leakage is located in a range of 0.5 nm–1.5 nm from a surface thereof, and in a range of 0.3 nm–2.0 nm from an interface thereof with the silicon substrate, and an element concentration peak of nitrogen is $7 \times 10^{21}$ or greater,
   wherein the means for reducing an amount of gate leakage includes an oxide film having a thickness in a range of 0.3 nm–1.0 nm.

9. A semiconductor device comprising:
   a silicon substrate; and
   means for reducing an amount of gate leakage, wherein a peak position of a concentration of nitrogen of the means for reducing an amount of gate leakage is located in a range of 0.5 nm–1.5 nm from a surface thereof, and in a range of 0.3 nm–2.0 nm from an interface thereof with the silicon substrate, and an element concentration peak of nitrogen is $7 \times 10^{21}$ or greater,
   wherein the means for reducing an amount of gate leakage includes an oxynitride film having a thickness in a range of 0.3 nm–1.5 nm.

* * * * *